United States Patent [19]
Park et al.

[11] Patent Number: 5,349,559
[45] Date of Patent: Sep. 20, 1994

[54] INTERNAL VOLTAGE GENERATING CIRCUIT

[75] Inventors: Yong-Bo Park, Suwon; Hyung-Kyu Lim, Seoul, both of Rep. of Korea

[73] Assignee: SamSung Electronics Co., Ltd., Kyungki-do, Rep. of Korea

[21] Appl. No.: 940,205

[22] Filed: Aug. 18, 1992

[30] Foreign Application Priority Data

Aug. 19, 1991 [KR] Rep. of Korea ............ 14272/1991

[51] Int. Cl.$^5$ ............................................. G11C 29/00
[52] U.S. Cl. ........................... 365/201; 365/226; 307/296.6
[58] Field of Search ............... 365/189.09, 201, 226; 307/272.3, 296.6, 350

[56] References Cited

U.S. PATENT DOCUMENTS

| | | | |
|---|---|---|---|
| 4,095,164 | 6/1978 | Ahmed | 323/226 |
| 4,398,833 | 6/1983 | Tzang | 368/156 |
| 4,670,861 | 6/1987 | Shu et al. | 365/226 |
| 4,797,377 | 1/1989 | Hing | 501/39 |
| 4,868,483 | 9/1989 | Tsujimoto | 323/313 |
| 5,046,052 | 9/1991 | Miyaji et al. | 365/189.09 |
| 5,063,304 | 2/1991 | Iyengar | 365/189.09 |
| 5,128,863 | 7/1992 | Nakamura et al. | 365/228 |
| 5,249,155 | 9/1993 | Arimoto et al. | 365/189.09 |

Primary Examiner—Eugene R. LaRoche
Assistant Examiner—F. Niranjan
Attorney, Agent, or Firm—Robert E. Bushnell

[57] ABSTRACT

A circuit for generating an internal voltage to be supplied to memory elements of a semiconductor memory chip during normal operation and for providing an external voltage to the memory elements during a burn-in test operation. The circuit may be constructed with a driver circuit (50) which receives an external voltage and is controlled to generate the internal voltage. A comparator (300) compares the internal voltage to a first reference voltage to produce a control signal G2 to control the driver circuit (50). An external voltage detector (100) compares a second reference voltage to the external voltage to generate control signal B2. A driver control circuit (200) is enabled by control signal B2, if the external voltage is less than the second reference voltage, to pass control signal G2 to the driver circuit and thereby enable generation of the internal voltage to be equal to, or less than, the operating voltage of the semiconductor memory chip. The driver control circuit is disabled by control signal B2 if the external voltage is greater than the second reference voltage, thereby preventing the control signal G2 of the comparator from controlling conduction by the driver circuit (50) to enable output of the external voltage exhibiting an elevated amplitude to the memory elements for burn-in test operation.

21 Claims, 3 Drawing Sheets

INTERNAL VOLTAGE GENERATING CIRCUIT

BACKGROUND OF THE INVENTION

The present invention relates to a semiconductor memory device, and more particularly, to a circuit for generating an internal voltage readily amenable to incorporation into a highly integrated semiconductor memory device.

As a semiconductor memory device is highly integrated, the elements thereof become more and more miniaturized, such as transistors which are constructive elements in a chip. In this case, when supplied with an external voltage that has been supplied to the elements not miniaturized, the miniaturized elements, such as the transistors, may be destroyed by the stress caused by the relatively strong electric field. Hence a semiconductor memory device that is highly integrated, that is, a device rated at sixteen megabytes (mega: $10^6$) or over in capacity, requires a circuit for generating an internal voltage by reducing the amplitude of an external voltage to the amplitude of the operating voltage for the chip. For example, a semiconductor memory device of sixteen megabytes in capacity must use an internal voltage of about four volts, and usually obtains that internal voltage by reducing the amplitude of an external voltage of five volts. Moreover, a semiconductor memory device of over sixteen megabytes of capacity will use external and internal voltages of even lower amplitude.

One of the more popular designs of a conventional internal voltage generator reduces the amplitude of an external voltage to a given level required for the operation of a semiconductor memory chip by applying an internal voltage provided by a driver stage to both the memory elements of the chip and to one input port of a comparator. If the internal voltage falls in amplitude, the reduced amplitude is detected by the comparator, which, in turn, lowers an output voltage. The driver is driven into greater conductivity in response to a reduction in the amplitude of the output voltage, thereby compensating for the drop in the amplitude of the internal voltage. The operational characteristics of comparators are well-known in the art, and a more detailed description of comparators is not necessary for this explanation, except to note that popular designs for internal voltage generating circuits typically produce a constant internal voltage despite receiving an external voltage which has a value exceeding a given level.

Such conventional internal voltage generating circuits however, can not provide an internal voltage equal to the external voltage in order to subject a semiconductor chip to a post-production quality test such as a "burn-in test" (i.e., a post-production test conducted by some of the more responsible semiconductor manufacturers in which finished semiconductor chips are subjected to a high test voltage that exceeds a given value at a high temperature for a long time so as to expose imperfect chips) because such internal voltage generating circuits are designed to always provide a particular internal voltage corresponding to normal operational modes of the chip in response to any externally applied voltage. Consequently, it is nearly impossible to readily check and identify the imperfect chips among batches of conventional internal voltage generators, thus resulting in a considerable loss of time during subsequent efforts to use unreliable chips as well as a reduction in the reliability of the semiconductor memory devices incorporating conventional internal voltage generators.

SUMMARY OF THE INVENTION

It is an object of the present invention to provide an improved voltage generating circuit.

It is another object to provide an internal voltage generating circuit amenable to providing an internal voltage exhibiting an elevated amplitude in response to application of a high amplitude external test voltage.

It is yet another object to provide an internal voltage generating circuit capable of supplying a given internal source voltage to a semiconductor memory device when an externally applied voltage is within a given range.

It is still another object to provide an internal voltage generating circuit capable of supplying an external voltage when the externally applied voltage itself exceeds a specified level.

According to the principles of the present invention, these and other objects may be achieved with a circuit for generating a given internal voltage applied to the memory elements of a semiconductor chip comprising a reference voltage generating circuit, a differential amplifier receiving the reference voltage and a given internal voltage, a driver circuit producing the internal voltage under the control of the differential amplifier, and a circuit controlling the gate signal applied to a gate electrode of the driver circuit so as to cause the driver circuit to produce either the internal voltage of the reference voltage or the external voltage level while respectively in a first or second state. The first and second states respectively occur when the externally applied voltage respectively, is less than or greater than a set voltage, for example, six volts.

BRIEF DESCRIPTION OF THE ATTACHED DRAWINGS

For a better understanding of the invention, and to show how the same may be carried into effect, reference will be made to the following detailed description, in connection with the accompanying diagrammatic drawings, in which.

DETAILED DESCRIPTION OF THE PREFERRED EMBODIMENT

Figure 1:
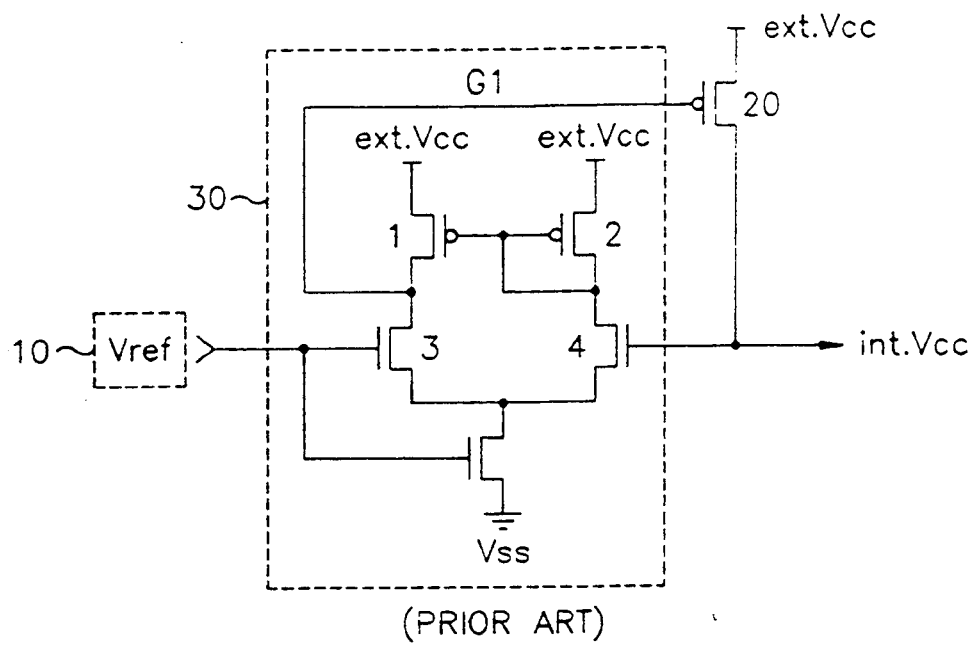
FIG. 1 is a schematic diagram illustrating a conventional circuit for generating an internal voltage.

Turning now to the drawings, FIG. 1 shows one popular design for conventional internal voltage generators, which drops the level of an external voltage to a given level required for the operation of a semiconductor memory chip. The internal voltage generator comprises a reference voltage generating circuit 10 for generating a reference voltage $V_{ref}$, comparator 30 of a differential amplifier for comparing the internal voltage with the reference voltage $V_{ref}$, and a driver transistor 20 adjusting the external voltage ext.$V_{cc}$ to the internal voltage int.$V_{cc}$ according to the output voltage G1 applied by comparator 30 to the gate electrode of driver transistor 20.

Figure 2:
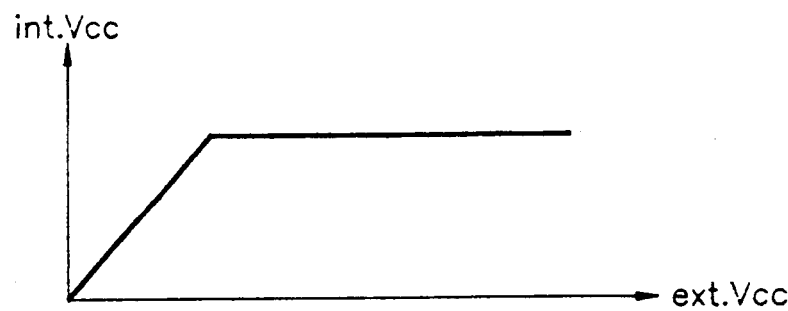
FIG. 2 is a graph showing the output characteristics of the circuit of FIG. 1.

The internal voltage int.$V_{cc}$ produced by driver transistor 20 is applied to the memory elements (not shown) of the chip as well as one input of the comparator 30. If the internal voltage drops in amplitude, the drop is detected by transistor 4 of comparator 30, and comparator 30 responds to lower the output voltage G1; then the driver 20 is driven into greater conduction to compensate for the drop in amplitude of the internal voltage. The operational characteristics of comparator 30 are well-known in the art, and further detailed description thereof is unnecessary. Such conventional internal voltage generating circuits however, undesirably always produce a constant internal voltage upon application of an external voltage that has a value exceeding a given level, as is shown in FIG. 2.

Figure 3:
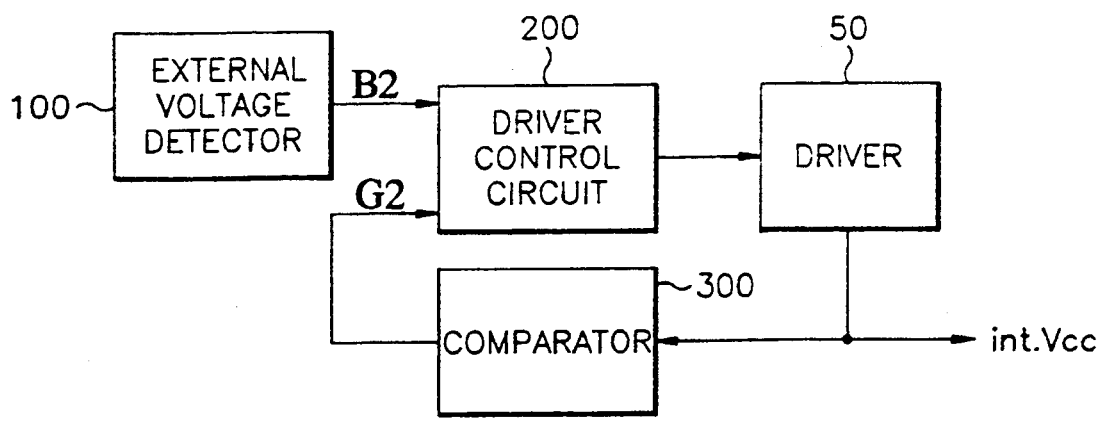
FIG. 3 is a block diagram for illustrating a circuit for generating an internal voltage according to the present invention.

Turning now to FIG. 3, a circuit shown as constructed, according to the principles of the present invention for generating an internal voltage, has an external voltage detector 100 for detecting an externally applied voltage, a driver control circuit 200, a comparator 300 and a driver 50. The external voltage detector 100 provides driver control circuit 200 with a signal B2 representing the amplitude of the potential ext.$V_{cc}$ applied to the voltage source terminal of the circuit.

The driver control circuit 200 enables, or disables, the output of the comparator 300 in response to the signal B2 from external voltage detector 100 and controls the "turn on" operation of driver 50. The internal construction of the comparator 300 and driver 50 are well-known in this technical field.

Figure 4:
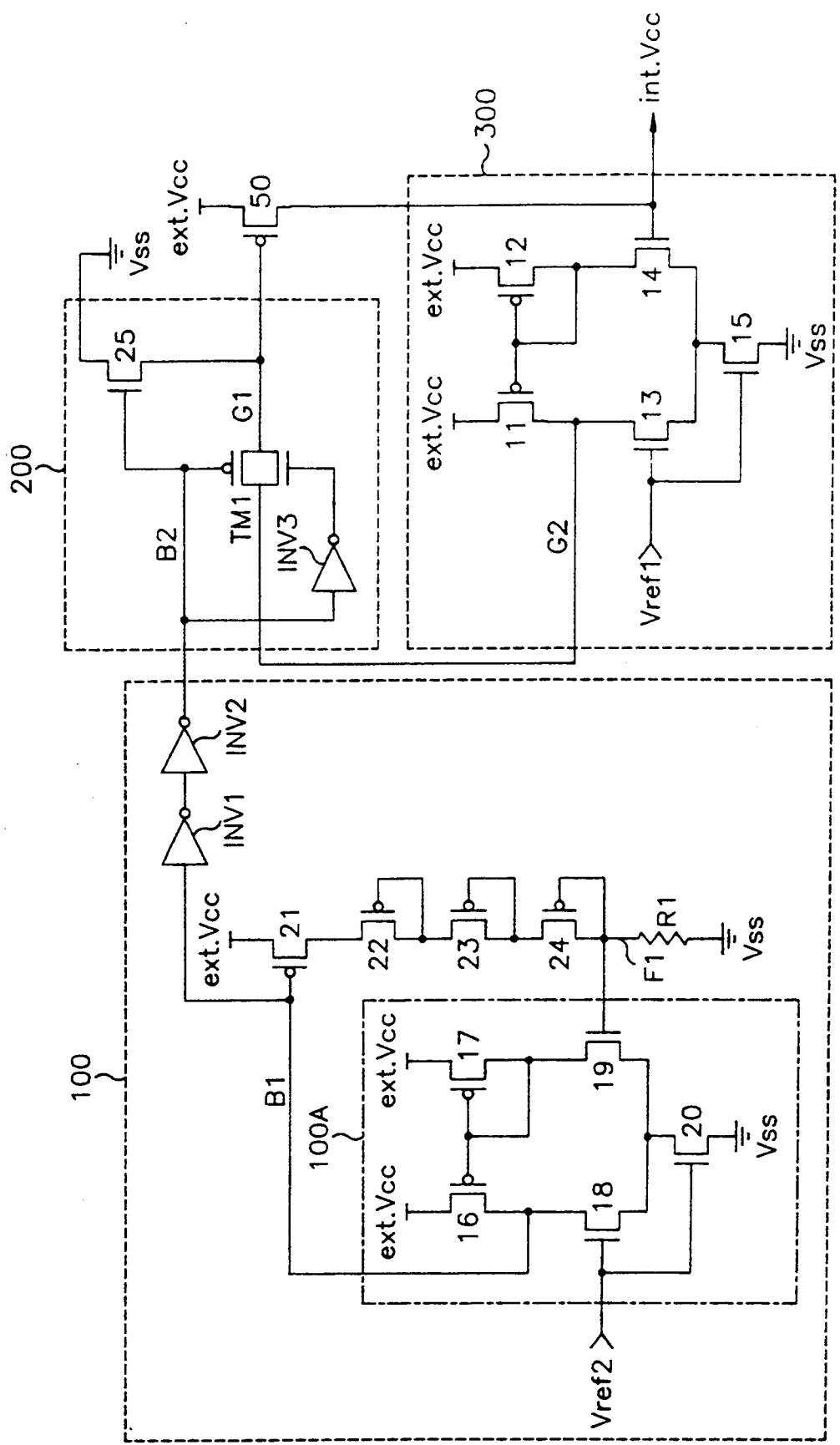
FIG. 4 is a specific embodiment of FIG. 3.

Referring now to FIG. 4, the external voltage detector 100 comprises a pull-up transistor 21 with one end of the channel connected to the external voltage terminal ext.$V_{cc}$, a voltage dropping transistor circuit formed by serial connections of the drain and source electrodes of transistors 22, 23, 24 so that their channels are connected in series with the other end of the channel of pull-up transistor 21, pull-down resistor R1 connected between the channels of the voltage dropping transistors 22, 23, 24, and local source potential $V_{ss}$ and a differential amplifier circuit 100A whose first input is connected to the common node F1 between the voltage dropping transistors 22, 23, 24 and pull-down resistor R1, and whose second input is supplied with a second reference voltage $V_{ref2}$. The output of the differential amplifier circuit 100A is connected to the control terminal of pull-up transistor 21 and to the input of the first of two serially coupled inverters INV1 and INV2.

The number of diode connected PMOS transistors 22, 23, 24 of the voltage dropping transistor circuit may be adjusted according to the externally applied voltage ext.$V_{cc}$. The two inverters INV1 and INV2 form a driver circuit for amplifying signal B1 output from the differential amplifier circuit 100A. The amplitude of the second reference voltage $V_{ref2}$ is adjusted according to the specified value of the external source voltage, and may be generated by a reference voltage generating circuit (not shown).

The driver control circuit 200 may be constructed with a transmission gate TM1 and a pull-down transistor 25. The channel of the transmission gate TM1 is connected between the output line of the comparator 300 (to receive control signal G2 from comparator 300) and the control terminal of the driver transistor 50. The output of the external voltage detector 100 is applied as control signal B2 of the transmission gate TM1. The pull-down transistor 25 has a gate electrode controlled by the control signal B2 output from the external voltage detector 100, and a channel between one end of a channel of the transmission gate TM1 and a ground, where one end of the channel is connected to G1 line between the channel of the transmission gate TM1 and the control terminal of driver transistor 50, and the other end of the channel is connected to the ground terminal. It is noted that the output signal of the external voltage detector 100 to turn off the transmission gate TM1 turns on the pull-down transistor 25, thereby dropping the voltage of G1 to the ground voltage level, thereby completely turning on driver transistor 50.

Hereinafter, the operation of the circuit of FIG. 4 will be described.

If the externally applied voltage ext. $V_{cc}$ has an amplitude insufficient to make node F1 (or B1) of the external voltage detector 100 have a high logic level (namely, when the externally applied voltage has a level below the specified value of the chip, and thus the amplitude of voltage at node F1 is less than the second reference voltage $V_{ref2}$), the output B2 of the external voltage detector 100 goes to a logic "low", so that the transmission gate TM1 of the driver control circuit 200 is turned "on" to an electrically conducting state and pull-down transistor 25 is turned "off" to an electrically non-conducting state. Hence, the output control signal G2 of comparator 300 is applied to the control terminal of driver transistor 50. In this case, the inventive circuit operates in the same manner as the conventional circuit of FIG. 1, and the level of the internal voltage int.$V_{cc}$ changes within interval t1 shown in the coordinate graph of FIG. 5. If the externally applied voltage ext.$V_{cc}$ continues to have a level below the specified value, the amplitude of int.$V_{cc}$ is similar to that shown in FIG. 2 of a conventional circuit.

In order to perform a particular task such as "burn-in test", if the externally applied voltage has an amplitude above the specified value, the voltage at node F1 exceeds the second reference voltage $V_{ref2}$ and thus the voltage of output signal B1 represents a logic "high" level (the externally applied voltage ext.$V_{cc}$ to make the voltage of output signal B1 have "high" level is readily obtained by adjusting the value of the resistor R1 and the number of the PMOS transistors 22, 23, 24 of the voltage dropping circuit). The output signal B1 with logic "high" level is applied as the control signal B2 with a "high" logic level to the driver control circuit 200 via the two inverters INV1 and INV2. The voltage of B1 continues to have a "high" logic level because the differential amplifier circuit 100A causes the pull-up transistor 21 to alternately turn "on" and "off" with a very short period.

Hence, control signal B2 with a "high" logic level turns "off" logic transmission gate TM1 of the driver control circuit 200, and turns "on" the pull-down transistor 25. Then the output G2 of comparator 300 is disconnected from the control terminal of the driver transistor 50, and the G1 voltage is discharged through the channel of the turned-on pull-down transistor 25 to ground terminal. Consequently, driver transistor 50 is completely driven into electrical conduction (i.e., is completely turned "on" so as to make the internal voltage int. $V_{cc}$ have the level of the externally applied voltage ext.$V_{cc}$. Of course, as long as the externally applied voltage has a level above the specified value, amplitudes of output signal B1 and control signal B2 continue to have high logic levels, so that the internal voltage is maintained to have the same amplitude as the externally applied voltage ext.$V_{cc}$. In this case, control signal G2 from comparator 300 is kept disconnected from the control terminal of the driver transistor 50.

Figure 5:
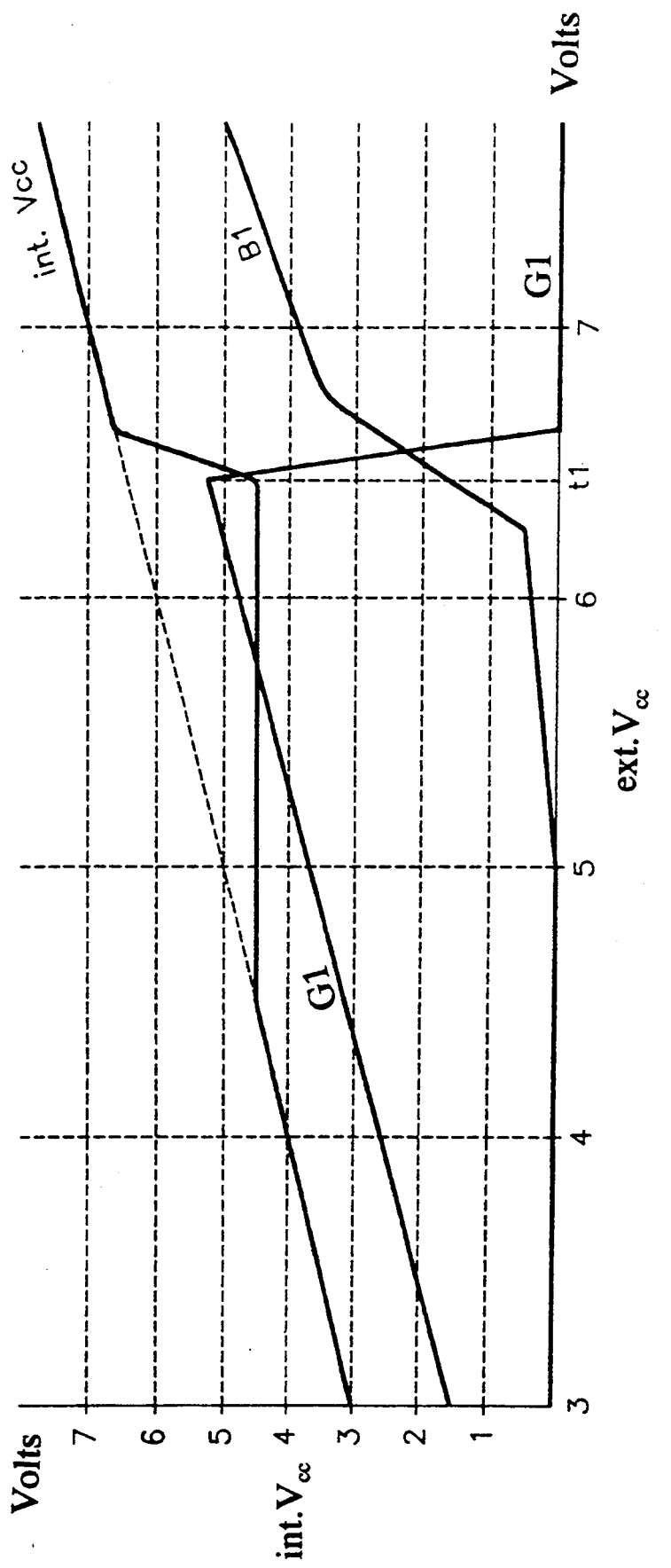
FIG. 5 is a graph showing the output characteristics of the circuit of FIG. 4.

Thus, after expiration of period t1, when the externally applied voltage ext.$V_{cc}$ has an amplitude above the specified value of the chip, the internal voltage int.$V_{cc}$ is maintained at the same amplitude as the externally applied voltage ext.$V_{cc}$ (in FIG. 5, the position of interval t1 may be properly adjusted towards either the left or right along the abscissa of the graph according to the characteristics of the chip). Consequently, the internal voltage may have the same amplitude as the externally applied voltage so that the "burn-in test" may be easily performed so as to detect imperfect chips.

It may be seen therefore that there is provided a circuit for generating an internal voltage to be supplied to memory elements of a semiconductor memory chip during normal operation and for providing an external voltage ext.$V_{cc}$ to the memory elements during, for example, a burn-in test operation. The circuit may be constructed with driver transistor 50 which receives an external voltage ext.$V_{cc}$ and is controlled to generate the internal voltage int.$V_{cc}$. Comparator 300 compares the internal voltage to a first reference voltage $V_{ref1}$ to produce a control signal G2 to control the driver transistor. External voltage detector 100 compares a second reference voltage $V_{ref2}$ to the external voltage to generate control signal B2. Driver control circuit 200 is enabled by control signal B2 if the external voltage is less than the second reference voltage, to pass control signal G2 to driver transistor 50 and thereby enable generation of the internal voltage to be equal to, or less than, the operating voltage of the semiconductor memory chip. Driver control circuit 200 is disabled by control signal B2 if the external voltage is greater than the second reference voltage, thereby preventing the control signal G2 of comparator 300 from controlling conduction by driver transistor 50, to enable output of the external voltage exhibiting an elevated amplitude to the memory elements for burn-in test operation.

Although the circuit of FIG. 4 is a preferred embodiment of the present invention, the parts and components thereof may be differently embodied without departing from the spirit of the invention.

What is claimed is:

1. A voltage generating circuit for use with a semiconductor memory device, for providing an internal voltage to said memory device during normal operation and for providing an external voltage during a burn-in test operation of said semiconductor memory device, said semiconductor memory device having a predetermined operating voltage, said voltage generating circuit comprising:

driver means coupled to receive said external voltage, for generating said internal voltage from said external voltage in response to a first control signal;

first comparing means for comparing said internal voltage to a first reference voltage to generate said first control signal;

second comparing means for generating a second control signal representing a comparison between said external voltage and a second reference voltage, said second comparing means comprising:

a first transistor having a first electrode of a principal electrically conducting channel connected to a first terminal of said external voltage and a control electrode coupled to receive said second control signal;

voltage reducing means interposed between a second electrode of said principal electrically conducting channel of said first transistor and a common node, for reducing an amplitude of said external voltage;

a resistor interposed between said common node and a second terminal of a reference potential; and differential amplifier means interposed between said first terminal of said external voltage and said second terminal of said reference potential and connected to said common node, for comparing said external voltage with said first reference voltage to provide said second control signal; and control means responsive to said second control signal, for enabling and disabling reception of said first control signal by said driver means, said driver means providing said internal voltage to said semiconductor memory device when said control means enables said first control signal to be received by said driver means, and said driver means providing said external voltage to said semiconductor memory device when said control means disables reception of said first control signal by said driver means.

2. The circuit of claim 1, wherein said second reference voltage is substantially the same as said predetermined operating voltage of said semiconductor memory device.

3. The circuit of claim 1, wherein said voltage reducing means comprises a plurality of diode connected transistors coupled in series between said first transistor and said resistor.

4. The circuit of claim 3, wherein said plurality of diode connected transistors are comprised of transistors.

5. The circuit of claim 4, wherein said control means comprises:

transmission gating means having a control terminal coupled to receive said second control signal and a channel responsive to said second control signal, for enabling and disabling reception of said first control signal by said driver means; and a second transistor providing a principal current conducting path connected between a second local potential and said channel of said transmission gating means, said second transistor having a control electrode connected to said control terminal of said transmission gating means.

6. The circuit of claim 1, wherein said control means comprises:

transmission gating means having a control terminal coupled to receive said second control signal and a channel responsive to said second control signal, for enabling and disabling reception of said first control signal by said driver means; and a transistor providing a principal current conducting path connected between a second local potential and said channel of said transmission gating means, said transistor having a control electrode connected to said control terminal of said transmission gating means.

7. A circuit for converting an externally applied voltage having a first amplitude into an internal exhibiting a second amplitude, said circuit comprising;

comparing means coupled to receive a reference voltage and said internal voltage, for providing a first control signal in response to said internal voltage relative to said reference voltage;

sensing means for generating a second control signal in dependence upon variations in said externally applied voltage, said second control signal having one of first and second logic states of opposite polarity determined in dependence upon said first amplitude of said externally applied voltage;

driving means for producing one of said internal voltage and said externally applied voltage in response to said first control signal; and control means for regulating transmission of said first control signal to said driving means according to logic states of said second control signal.

8. The circuit of claim 7, wherein a control electrode of said driving means is coupled by said control means to receive said first control signal while said second control signal exhibits said first logic state, and said control electrode is prevented by said control means from receiving said first control signal while said second control signal exhibits said second logic state different from said first logic state.

9. A voltage generating circuit for providing an internal voltage and an elevated voltage greater than said internal voltage, to a semiconductor memory device, said voltage generating circuit comprising:

first comparison means for comparing an external voltage to a first reference voltage to generate a first control signal, said first comparison means comprising:

transistor means having a first end of a channel connected to said external voltage and a control terminal providing said first control signal;

voltage dividing means connected to a second end of said channel of said transistor means, for dividing said external voltage to generate a divided voltage; and differential amplifier means for comparing said first reference voltage and said divided voltage to generate said first control signal;

second comparison means for comparing said internal voltage to a second reference voltage to generate a second control signal;

control means for enabling transmission of said second control signal in dependence upon said first control signal; and driver means coupled to receive said external voltage, for providing one of said internal voltage and said elevated voltage to said semiconductor memory device in response to receipt of said second control signal transmitted from said control means.

10. The voltage generating circuit as claimed in claim 9, wherein said voltage dividing means comprises:

a plurality of serially connected diode-connected transistors having a first end coupled to said second end of said channel of said transistor means, and a second end to a node providing said divided voltage; and a resistor interposed between said node and a third reference voltage.

11. The voltage generating circuit as claimed in claim 9, wherein said control means comprises:

switch means for enabling transmission of said second control signal to said driver means when said first control signal is in a first logic state to enable said driver means to generate said internal voltage; and pull-down means for discharging voltages of said second control signal from said driver means when said first control signal is in a second logic state opposite to said first logic state to enable said driver means to generate said elevated voltage.

12. The voltage generating circuit as claimed in claim 11, wherein said pull-down means is a transistor having a first electrode of a principal electrically conducting channel coupled to receive said third reference voltage, a second electrode of said principal electrically conducting channel connected to said control electrode of said driver means and a control electrode coupled to receive said first control signal.

13. A voltage generating circuit for converting an externally applied voltage having a first amplitude into an internal voltage exhibiting a second amplitude, comprising:

comparing means coupled to receive a reference voltage and said internal voltage, for providing a first control signal in response to said internal voltage relative to said reference voltage;

sensing means for generating a second control signal in dependence upon variations in said externally applied voltage, said second control signal having one of first and second logic states of opposite polarity determined in dependence upon said first amplitude of said externally applied voltage;

driving means for providing one of said internal voltage and said externally applied voltage in dependence upon said first control signal; and control means for regulating transmission of said first control signal to said driving means according to logic states of said second control signal, said control means comprising:

switch means for enabling transmission of said first control signal to said driving means when said second control signal is in said first logic state to enable said driving means to generate said internal voltage; and pull-down means for discharging voltages of said first control signal from said driving means when said second control signal is in said second logic state to enable said driving means to generate said externally applied voltage.

14. The voltage generating circuit as claimed in claim 13, wherein said pull-down means is a transistor having a first electrode of a principal electrically conducting channel coupled to receive a reference voltage, a second electrode of said principal electrically conducting channel connected to said control electrode of said driver means and a control electrode coupled to receive said second control signal.

15. The voltage generating circuit as claimed in claim 13, wherein said switch means is a transmission gate for enabling transmission of said first control signal to said driving means in dependence upon the logic states of said second control signal, said transmission gate having control electrodes coupled to receive said second control signal, and a principal electrically conducting channel interposed between said comparing means and said driving means, for enabling transmission of said first control signal.

16. The voltage generating circuit as claimed in claim 13, wherein said sensing means comprises:

differential amplifier means for comparing said externally applied voltage with a first reference voltage to provide said first control signal;

a pull-up transistor having a first electrode of a principal electrically conducting channel connected to a first terminal and a control electrode coupled to receive said first control signal;

a plurality of diode-connected transistors serially connected between a second electrode of said principal electrically conducting channel of said pull-up transistor and a common node, for reducing an amplitude of said externally applied voltage;

resistor means interposed between said common node and a second terminal.

17. A voltage generating circuit for providing an internal voltage and an elevated voltage to a semiconductor memory device, comprising:

detecting means for generating a first control signal of a first logic state when an external voltage is less than a first reference voltage, and for generating said first control signal of a second logic state when said external voltage is greater than said first reference voltage, said detecting means comprising:

differential amplifier means interposed between a first terminal of said external voltage and a second terminal of a reference potential, for comparing said external voltage with said first reference voltage to provide said first control signal; and transistor means having a first electrode of a principal electrically conducting channel connected to said first terminal, a second electrode of said principal electrically conducting channel connected to said second terminal via a plurality of serially connected diode-connected transistors, and a control electrode coupled to receive said first control signal;

comparing means for comparing said internal voltage to said first reference voltage to generate a second control signal;

driving means connected to said external voltage, for providing one of said internal voltage and said elevated voltage to the semiconductor memory device in dependence upon said second control signal; and control means for enabling transmission of said second control signal to said driving means when said first control signal is in said first logic state, and discharging voltages of said second control signal from said driving means when said first control signal is in said second logic state.

18. The voltage generating circuit as claimed in claim 17, wherein said control means comprises:

a transmission gate for enabling transmission of said second control signal to said driving means in dependence upon said first control signal, said transmission gate having control electrodes coupled to receive said first control signal and a principal electrically conducting channel interposed between said comparing means and said driving means; and a pull-down transistor having a first electrode of a principal electrically conducting channel connected to said second terminal of said reference potential, a second electrode of said principal electrically conducting channel connected to said driving means, and a control electrode coupled to receive said first control signal.

19. A voltage generating circuit for a semiconductor memory device, comprising:

a first terminal for providing a first reference voltage;

a second terminal for providing a second reference voltage;

a third terminal for providing a third reference voltage;

an input terminal for receiving an external voltage;

an output terminal for providing one of an internal voltage and said external voltage;

external voltage detector means for generating a first control signal in dependence upon comparison of said external voltage with said reference voltage;

comparator means for generating a second control signal in dependence upon comparison of said internal voltage with said second reference voltage;

driving transistor means for generating one of said internal voltage and said external voltage at said output terminal in dependence upon said second control signal, said driving transistor means having a first electrode of a principal electrically conducting channel connected to said input terminal, a second electrode of said principal electrically conducting channel connected to said output terminal, and a control electrode coupled to respond to said second control signal; and driver control means for controlling said driving transistor means to generate one of said internal voltage and said external voltage by regulating transmission of said second control signal to said driving transistor means in dependence upon logic states of said first control signal, said driver control means comprising:

a transmission gate for enabling transmission of said second control signal to said driving transistor means in dependence upon said first control signal, said transmission gate having a control electrode coupled to receive said first control signal and a principal electrically conducting channel interposed between said third terminal and said control electrode of said driving transistor means; and a pull-down transistor for discharging a voltage of said second control signal into said third terminal in dependence upon said first control signal, said pull-down transistor having a first electrode of a principal electrically conducting channel connected to said third terminal, a second electrode of said principal electrically conducting channel connected to said control electrode of said driving transistor means and a control electrode coupled to receive said first control signal.

20. The voltage generating circuit as claimed in claim 19, wherein said first control signal is representative of a logic "LOW" state when said external voltage is smaller than said first reference voltage, and is representative of a logic "HIGH" state when said external voltage is greater than said first reference voltage.

21. The voltage generating circuit as claimed in claim 20, wherein said external voltage detector means comprises:

a pull-up transistor having a first electrode of a principal electrically conducting channel connected to said first terminal and a control electrode coupled to receive said first control signal;

a plurality of diode-connected transistors serially connected between a second electrode of said principal electrically conducting channel of said pull-up transistor and a common node, for reducing an amplitude of said external voltage;

a resistor interposed between said common node and said third terminal; and differential amplifier means interposed between said common node and said first terminal, for comparing said external voltage with said first reference voltage to provide said first control signal.

* * * * *

UNITED STATES PATENT AND TRADEMARK OFFICE
CERTIFICATE OF CORRECTION

PATENT NO. : 5,349,559
DATED : August 18, 1992
INVENTOR(S) : Yong-Bo Park

It is certified that error appears in the above-indentified patent and that said Letters Patent is hereby corrected as shown below:

Column 6,     Line 67,     After "internal", Insert --voltage-- .

Signed and Sealed this

Twenty-eight Day of February, 1995

Attest:

BRUCE LEHMAN

Attesting Officer                  *Commissioner of Patents and Trademarks*